(12) United States Patent
Cunningham et al.

(10) Patent No.: US 8,102,663 B2
(45) Date of Patent: Jan. 24, 2012

(54) PROXIMITY COMMUNICATION PACKAGE FOR PROCESSOR, CACHE AND MEMORY

(75) Inventors: John E. Cunningham, San Diego, CA (US); Ashok V. Krishnamoorthy, San Diego, CA (US); Anders Landin, San Carlos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 434 days.

(21) Appl. No.: 11/864,762

(22) Filed: Sep. 28, 2007

(65) Prior Publication Data

US 2009/0089466 A1  Apr. 2, 2009

(51) Int. Cl.
 *H05K 7/00* (2006.01)
(52) U.S. Cl. ............................ 361/760; 361/803
(58) Field of Classification Search ............... 361/760, 361/761, 790, 720, 736, 748, 803; 439/950; 336/DIG. 2; 257/679, 686, 691, 777, 782, 257/797; 710/1, 2, 8, 36, 40, 62, 65, 100, 710/104, 305, 306, 308, 310–315; 711/117–119, 711/121, 133, 141, 146, 167, 169
See application file for complete search history.

(56) References Cited

U.S. PATENT DOCUMENTS

| 5,924,623 | A | | 7/1999 | Kenney | |
|---|---|---|---|---|---|
| 6,093,938 | A | * | 7/2000 | Minemier et al. | 257/80 |
| 6,127,726 | A | * | 10/2000 | Bright et al. | 257/691 |
| 6,150,724 | A | * | 11/2000 | Wenzel et al. | 257/777 |
| 6,310,400 | B1 | | 10/2001 | Doyle | |
| 2004/0227221 | A1 | | 11/2004 | Harris et al. | |
| 2005/0054139 | A1 | | 3/2005 | Drost et al. | |
| 2006/0087332 | A1 | | 4/2006 | Drost et al. | |
| 2006/0095639 | A1 | | 5/2006 | Guenin et al. | |
| 2007/0043894 | A1 | | 2/2007 | Zingher | |
| 2007/0075442 | A1 | | 4/2007 | Krishnamoorthy | |
| 2007/0194425 | A1 | * | 8/2007 | Zingher | 257/686 |
| 2007/0216036 | A1 | | 9/2007 | Krishnamoorthy | |

OTHER PUBLICATIONS

Drost, R. J. et al., "Proximity Communication", Sun Microsystems, Inc., Mountain View, CA, Sep. 2003. (4 pages).

(Continued)

*Primary Examiner* — Hung S Bui
(74) *Attorney, Agent, or Firm* — Park, Vaughan, Fleming & Dowler LLP (57) ABSTRACT

A "sombrero" bridge transports signal communication between a processor and one or more cache memories. The bridge surrounds the processor's perimeter, and includes an aperture opposite the processor through which power and data can be provided to the processor from another device. The bridge exchanges signals with the cache memories via capacitively coupled proximity connections. The bridge communicates with the processor via conductive (e.g. wire) connections and optionally proximity connections. Spacing between opposing pads of the proximity connection(s) between the bridge and the cache memories can be provided by recesses in a surface of the cache memory, corresponding recesses in an opposing surface of the bridge, and a ball for each matching pair of corresponding cache memory and bridge recesses. The ball fits in and between the recesses of the matching pair. The recess depths and ball diameter(s) constrain a minimum distance between opposing pads of the proximity connection(s).

20 Claims, 8 Drawing Sheets

OTHER PUBLICATIONS

Sandor, M. "Known-Good-Die Assurance for MCMs in Space Application", Jet Propulsion Laboratory, Electronic Parts Engineering, Apr. 13, 1998. (3 pages).

Kanellos, M. "Sun chips away at wireless chip connections", CNET News.com, Aug. 2, 2004, http://news.com.com:/Sun+chips+away+at+wireless+chip+connections/2100-1006_3-5291289.html (2 pages).

Sun Microsystems, Inc., "Proximity Communication—the Technology", Sep. 20, 2004, http://research.sun.com/spotlight/2004-09-20.feature-proximity.html (3 pages).

Collet, S. "Sun Lab's Proximity Communication Closely Quartered Chips: Data makes the leap between chips, creating communication that's 60 times faster", Computer World, Sep. 12, 2005, http://www.computerworld.com/softwaretopics/software/story/0,10801,104479,00.html (2 pages).

NASA, "Technology Readiness Overview—Embedded Actives—Known Good Die", Dec. 24, 2005, http://nepp.nasa.gov/index_nasa.cfm/1058/ (5 pages).

Shankland, S. "Sun: Chip connection tech on horizon", CNET News.com, Feb. 28, 2005, http://news.com.com/2100-1006_3-5593525.html (2 pages).

Wilson, John et al., "AC Coupled Interconnect using Buried Bumps for Laminated Organic Packages", pp. 41-48, Electronic Components and Technology Conference 2006, 56th San Diego, Ca, May 30, 2006.

* cited by examiner

PROXIMITY COMMUNICATION PACKAGE FOR PROCESSOR, CACHE AND MEMORY

GOVERNMENT LICENSE RIGHTS

The United States Government has a paid-up license in this invention and the right in limited circumstances to require the patent owner to license others on reasonable terms as provided for by the terms of Agreement No. NBCH020055 awarded by the Defense Advanced Research Projects Administration (DARPA).

FIELD OF THE INVENTION

Embodiments of the invention are directed to packaging solutions to enable Proximity Communication of signals between a processor and cache memory.

BACKGROUND

Driving bandwidth off a processor chip to L3 cache with low latency presents challenges, especially as processor technology continues to scale to future generations. In a few years a processor will need serial data rates of many 10 Gbps over many channels of communication to cache. The latency for this communication will continue to be impeded by the inability for electrical signaling to drive off chip without penalty. For example today's 10 Gbps serial links drive off chip to cache at a cost of several nanoseconds or several hundreds of processor clock cycles This can limit the ability of processors to utilize advancement in computational power, clock frequency, transistor count, multi-coring and so forth.

Proximity communication as a means to signal between processor and memory could alleviate this issue.

As noted in the Sun Microsystems document published Sep. 20, 2004 with web reference http://research.sun.com/spotlight/2004-09-20.feature-proximity.html, on the printed circuit boards of many computers, information and electrical power often travel over copper wires between CPUs (Central Processing Units), memory and I/O (Input/Output) devices. The copper wires connect the devices using technologies such as pins, ball bonding and solder bumps which involve macroscopic conductors that are massive in size compared to the submicron features on the chip itself.

In "proximity communication" data is conveyed between chips via capacitive couplings. Because this communication between chips does not rely on wired or conductive connections, the number of connections between chips can be much higher than with ball bonds (about 100 times greater, for example). The chips can talk at much higher speeds with lower latency and significantly less energy than using wires.

To form the capacitive couplings, microscopic metal pads are constructed out of standard top-layer metal structures during chip fabrication. These pads are then sealed with the rest of the chip components under a micron-thin layer of insulator to protect the chip from static electricity. Two chips, with receiver and transmitter pads, are then placed facing each other such that the pads are only a few microns apart. Each transmitter-receiver pad pair forms a capacitor, and voltage changes on the transmitter pad cause voltage changes on the receiver pad despite the lack of a conductive (e.g., wired) connection. This is akin to the physical effect that causes touch lamps to light when a human touches the conductive base of the lamp. Another analogy is the synaptic connection of biological nervous systems, where signals jump from one neuron to another.

Actual details can be more complex, including for example chip logic for driving and amplifying the signals, and the receiver circuit must tolerate far more variation than a conductive connection. The voltages involved can vary widely, so Proximity communication technology is often engineered to work over about a factor of ten voltage variation. Because mechanical misalignment can and will occur, it is desirable to compensate dynamically for effects such as vibration and unequal thermal expansion, and provide mechanisms that permit large voltage tolerance and dynamic reconfigure to overcome misalignment, so that Proximity communication may continue to function.

Proximity communication can provide an order-of-magnitude improvement in each of several dimensions: density, cost, speed, latency, and power demand. Because Proximity communication reduces the space taken up by the communication path, the power and the cost per bit transmitted, it can be possible to get tens of terabytes per second in and out of a single VLSI chip. Technologies in 2004 were limited to a few hundred gigabytes per second. With all dimensions taken into consideration, Proximity communication promises to improve overall capability as much as two orders-of-magnitude.

Proximity communication also permits "Wafer scale integration". Instead of trying to make processor chips ever larger, with resulting lower and lower yields, Proximity communication can allow one to lay out a "checkerboard" of chips that all behave as a single integrated circuit. Wafer scale integration has historically failed because the yield (e.g., known good die) drops to zero as the silicon area of a chip increases. With Proximity communication, one can get the same performance advantage as wafer scale integration but with excellent yield. When a flaw in a chip is discovered, Proximity communication allows one to simply lift out the chip and drop in a new one (clearly with some level of clean room conditions). This can be very expensive or impossible with prior art methods that connect chips to multi-chip modules, and force replacement of the entire circuit module instead of just the defective part.

Proximity communication also promises increased technologic versatility, so that different technologies can be mixed. "Processor in Memory" has been talked about as a way to put a complete computer system on a single chip, but the process technologies used to build CPUs are very different from the process technologies that are optimal for building dense memory like DRAM. Because Proximity communication lets each part be manufactured separately but then integrated using Proximity communication as the universal interface, the constraint of using a single manufacturing technology vanishes. It is even possible to mix, say, gallium arsenide and silicon chips in a single array. This is made possible by the fact that Proximity communication is inherently tolerant of different voltage levels needed for different semiconductor materials, and also by the fact that Sun Microsystems, Inc.'s approach includes asynchronous logic to remove the need for a common clock between two circuit chips.

Proximity communications also promises dramatic cost savings. Sockets, pins, and circuit boards add cost to a system, but Proximity communication eliminates them. And with Proximity communication, chips can be smaller than they are now, thereby increasing yield and decreasing the cost of each component chip.

Although proximity communication as a means to signal between processor and memory could alleviate the issue or challenge of driving bandwidth off a processor chip to L3 cache with low latency, a problem is that proximity signaling near the processor cannot be packaged in a low cost solution using industry standard packaging platforms. This is because proximity signaling needs tolerances much smaller than 10 microns to accomplish high fidelity signaling whereas manufacturing cannot achieve tolerance of better than a few mils or thousandths of an inch at low cost.

One of the issues with packaging proximity commutation is overcoming the flatness tolerances of first-level packages. Also there is significant interest in reworking multi-chip packages for the commercial market for processors. There are additional manufacturability issues associated with the "known good die" problem. Solutions such as Multichip Modules (MCM) have only a limited impact in packaging technology today owing to the known good die problem and the inability to significantly test chips until parts are packaged into the full assembly. Many of these problems, when applied to the processor cache unit, can be overcome by example embodiments of the invention described herein.

BRIEF SUMMARY

In accordance with an example embodiment of the invention, a "sombrero" bridge connects a processor (e.g. a microprocessor) with one or more cache memories, for example L3 (Layer 3) cache memories. The bridge surrounds a perimeter of the processor, and enables data or signal communication between the at least one cache memory and the processor. The bridge includes an aperture through the bridge and opposite the processor, and a power connection connects to the processor through the aperture. At least one proximity connection between the at least one cache memory and the bridge carries the signal communication. At least one signal connection is also provided between the processor and the bridge, and the signal connection includes electrically conductive material directly connected between the processor and the bridge.

In an example embodiment, communications between the bridge and the processor are provided by proximity connections. In an example embodiment, communications between the bridge and the cache memories are provided by proximity connections or electrically conductive connections.

In an example embodiment, spacing between opposing pads of the proximity connection(s) between the bridge and each cache memory is provided by a plurality of recesses in a surface of the cache memory, a plurality of corresponding recesses in an opposing surface of the bridge, and a ball for each matching pair of corresponding cache memory and bridge recesses. The ball is located between the cache memory recess and the corresponding bridge recess that form the matching pair, so that the depths of the matching recesses and the diameter of the ball constrain or define a minimum distance between opposing pads of the proximity connection(s).

In an example embodiment the recesses are rectangular, and long axes of the cache memory recesses are orthogonal to long axes of the corresponding bridge recesses.

In an example embodiment, instead of a single aperture the bridge includes multiple apertures through the bridge and opposite the processor, wherein each of the apertures includes a via that connects to the processor and is arranged to transport power or data signals to or from the processor.

In various example embodiments, the bridge has a thickness of less than 150 micrometers, and/or a compliance ranging between 20 and 30 micrometers to mitigate topology variations of the cache memory, processor and/or substrate(s) or components that physically support or locate them.

DETAILED DESCRIPTION

The present invention now will be described more fully hereinafter with reference to the accompanying drawings, which form a part hereof, and which show, by way of illustration, specific embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 2:
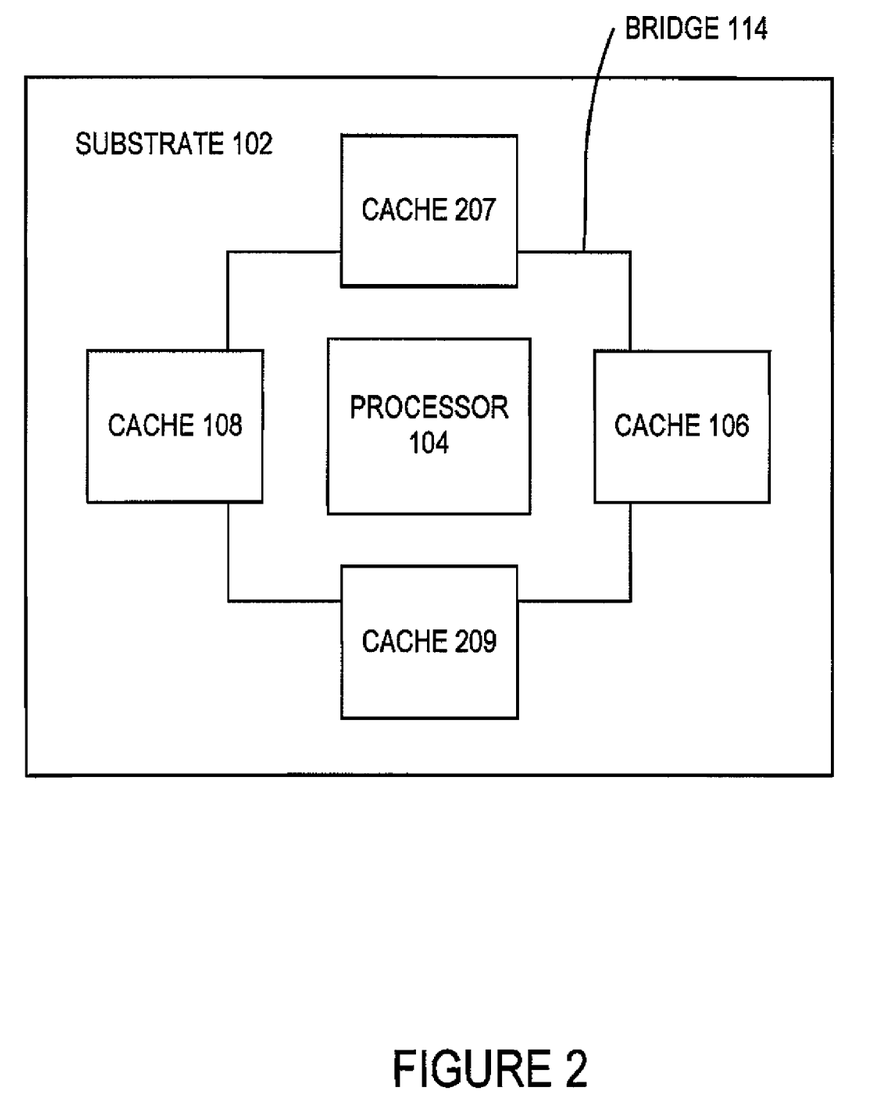
FIG. 2 illustrates a top view of components of the system shown in FIG. 1.

In an example embodiment illustrated in FIG. 2, which is a plan view of an upper side of a processor 104 mounted on a "sombrero" bridge 114 that surrounds a perimeter of the processor 104. The processor can be a microprocessor, such as the so-called Rock processor by Sun Microsystems Inc., of Santa Clara, Calif., or any other processor. The bridge 114 transports signal communication between the processor 104 and one or more cache memories 106, 108, 207, 209 that can, for example, be L3 (Layer 3) cache memory or any other type of memory, including for example any of L1 ... L4 memories, SRAM (Static Random Access Memory), DRAM (Dynamic Random Access Memory), and so forth. As shown in FIG. 2, the processor, bridge and cache memories can be mounted on or supported by a substrate 102. The bridge 114 exchanges signals with the cache memories via capacitively-coupled proximity connections. Spacing between opposing pads of the proximity connection(s) between the bridge and the cache memories can be provided by recesses in a surface of the cache memory, corresponding recesses in an opposing surface of the bridge, and a ball for each matching pair of corresponding cache memory and bridge recesses. The ball fits in and between the recesses of the matching pair. The recess depths and ball diameter constrain a minimum distance between opposing pads of the proximity connection(s). Co-pending U.S. application Ser. No. 11/243,300 and No. 11/385,445 (filed respectively on Oct. 3, 2005 and Mar. 20, 2006, and which are hereby incorporated by reference), disclose further details regarding this ball and recess-pair technique for maintaining clearance between pads of the proximity connection(s). The bridge 114 also includes an aperture opposite and underneath the processor 104, through which power and/or data signals can be provided to the processor from another device. In an example embodiment, the bridge 114 communicates with the processor 104 via electrically conductive connections, and optionally communicates data (which can include control signals as well as other information) via proximity connections between the bridge 114 and the processor 104.

Figure 1:
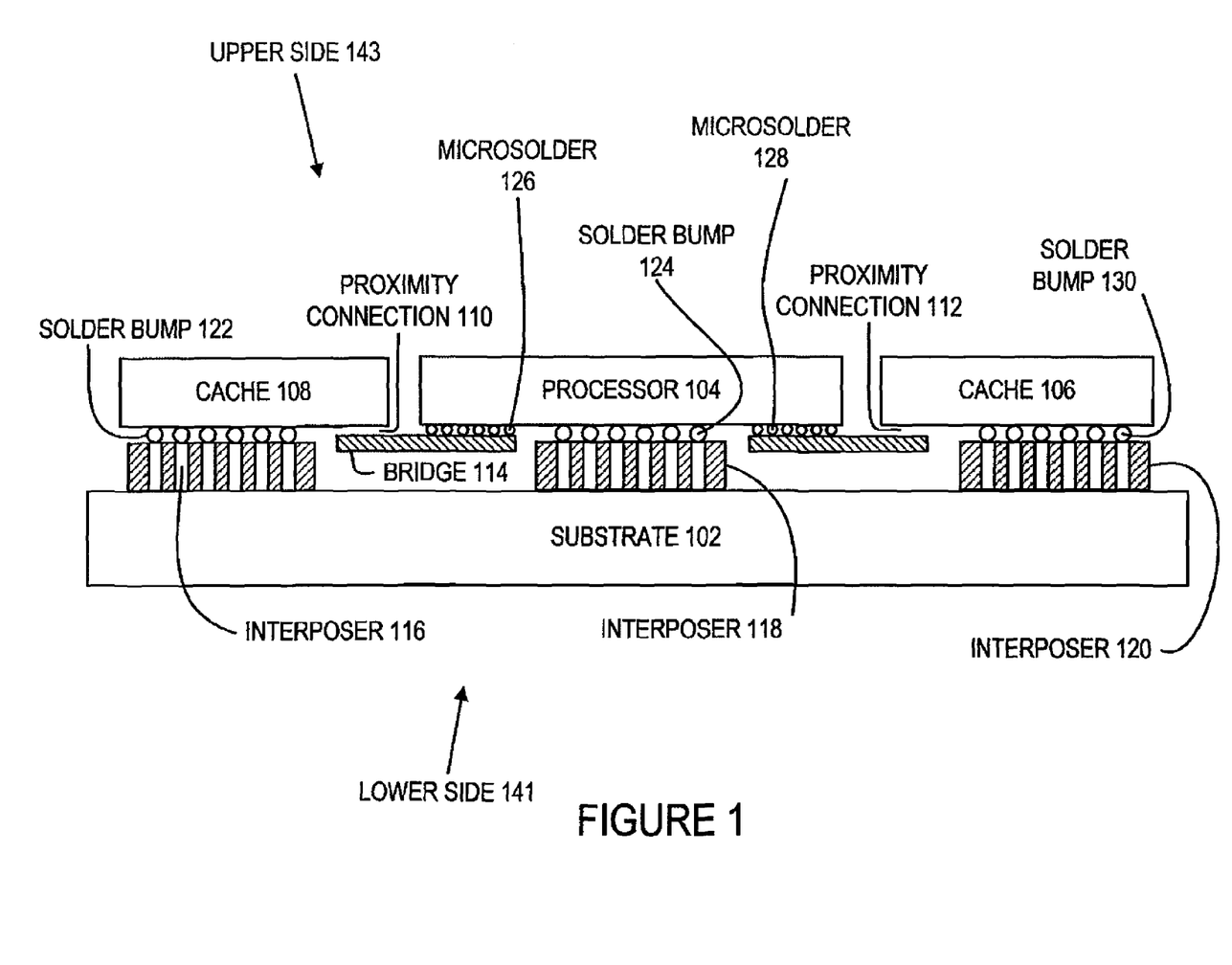
FIG. 1 illustrates a system in accordance with an example embodiment of the invention.

FIG. 1 illustrates a side view of the devices shown in FIG. 2, where the upper side 143 of FIG. 2 indicates the side or perspective shown in FIG. 1. In particular, FIG. 1 shows the processor 104 micro-soldered face-down on the bridge 114 microsolder connections, for example microsolder bumps 124, 126. As shown in FIG. 1, the center of the sombrero bridge 114 is fully open to expose additional connections on the lower face of the processor 104 and allow the processor 104 to connect through the aperture of the bridge 114 to another device such as the interposer 118 and substrate 102 as shown. The additional connections on the lower face of the processor 104 can include, for example, "C-4 bump" pads or fields such as the solder bump 124, to attach to a second level package such as the substrate 102. The wings or sides of the sombrero chip 114 include proximity pads (not shown in FIG. 1) to implement the capacitive signaling of the proximity connections 110, 112 between the bridge 114 and the caches 108, 106 (207, 209). The proximity pads on the bridge 114 mate, or match, with corresponding proximity pads (not shown) on the cache chips 108, 106 (207, 209). In example embodiments, ball and etch pits or recesses can be co-fabricated at the wafer level to align the four cache chips to the sombrero bridge 114. Application of alignment technology employing ball and etch pit in silicon (for example, as variously described in Co-pending U.S. Applications No. 11/243, 300 and No. 11/385,445) to embodiments described herein will be further described with respect to FIG. 5.

FIG. 1 further shows interposers 116, 118, 120 that connect the cache 108, processor 104, and cache 106 with the substrate 102. The caches 108, 106 (207, 209) connect to corresponding interposers via solder bumps such as the solder bumps 122, 124, 130, which can for example be C-4 bumps or any other suitable electrical connection mechanism.

Figure 3:
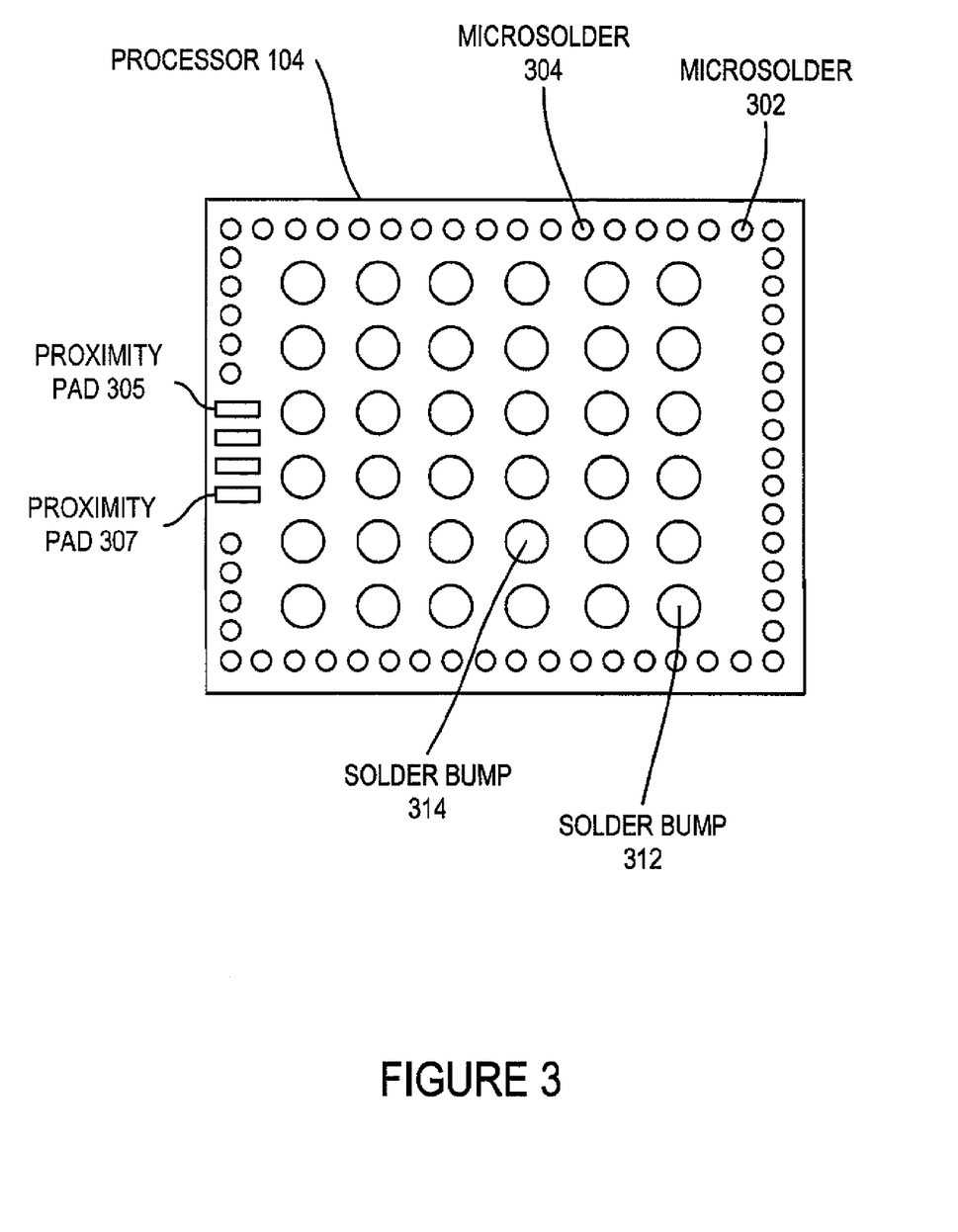
FIG. 3 illustrates a lower side or bottom view of a processor.

FIG. 3 illustrates the lower face of the processor 104 that faces the bridge 114 in FIGS. 1-2. As shown in FIG. 3, the processor 104 includes connections near its perimeter for connecting with the bridge 114, for example microsolder pads or bumps 302, 304, and can also optionally include proximity pads for forming one or more capacitively-coupled proximity connections with the bridge 114, for example the pads 305, 307. The processor 104 also includes connections to communication with other devices through one or more apertures or via in the bridge 114, for example the solder bumps 312, 314 which can be C-4 bumps that correspond generally to the solder bumps (e.g. solder bump 124) shown in FIG. 1. An example pitch of the micro-solder connections (e.g. 302, 304) can be 15 microns or micrometers, or any other value. An example pitch of the solder bumps at the center of the processor 104 (e.g. 312, 314) can be 50 microns, or any other appropriate value.

Figure 4:
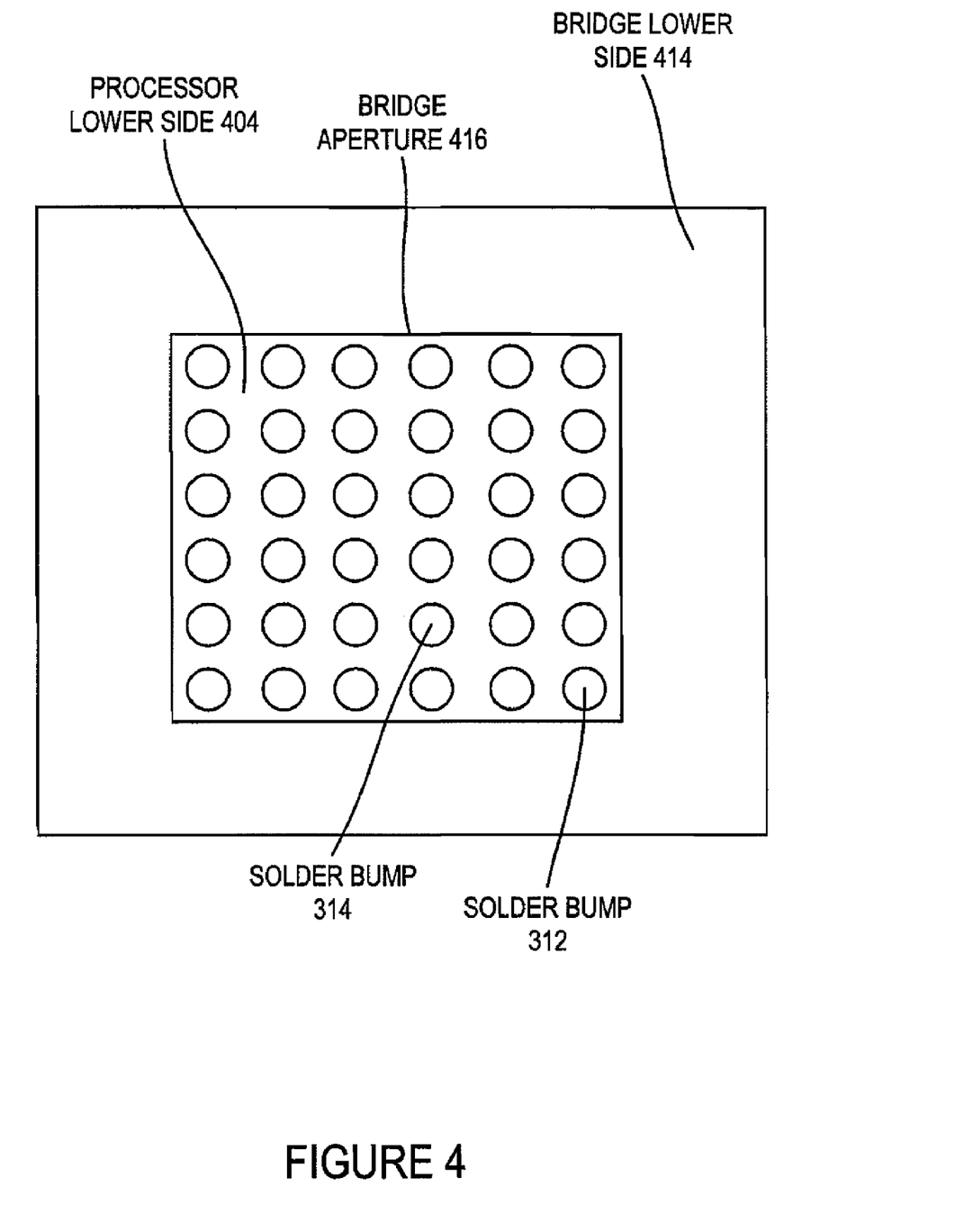
FIG. 4 illustrates a lower side or bottom view of a processor connected to or mounted on a bridge in accordance with an example embodiment.

FIG. 4 illustrates a view of the lower side 414 of the bridge 114 from the lower side direction 141, with the processor 104 mounted on the bridge 114. Thus, as shown in FIG. 4, the processor's lower side 404 can be seen through the opening or aperture 416 in the bridge, and also the connections on the lower side of the processor 104 including the solder bumps 314, 312 which generally correspond to the solder bumps shown in FIG. 1 (e.g., solder bump 124).

Figure 5:
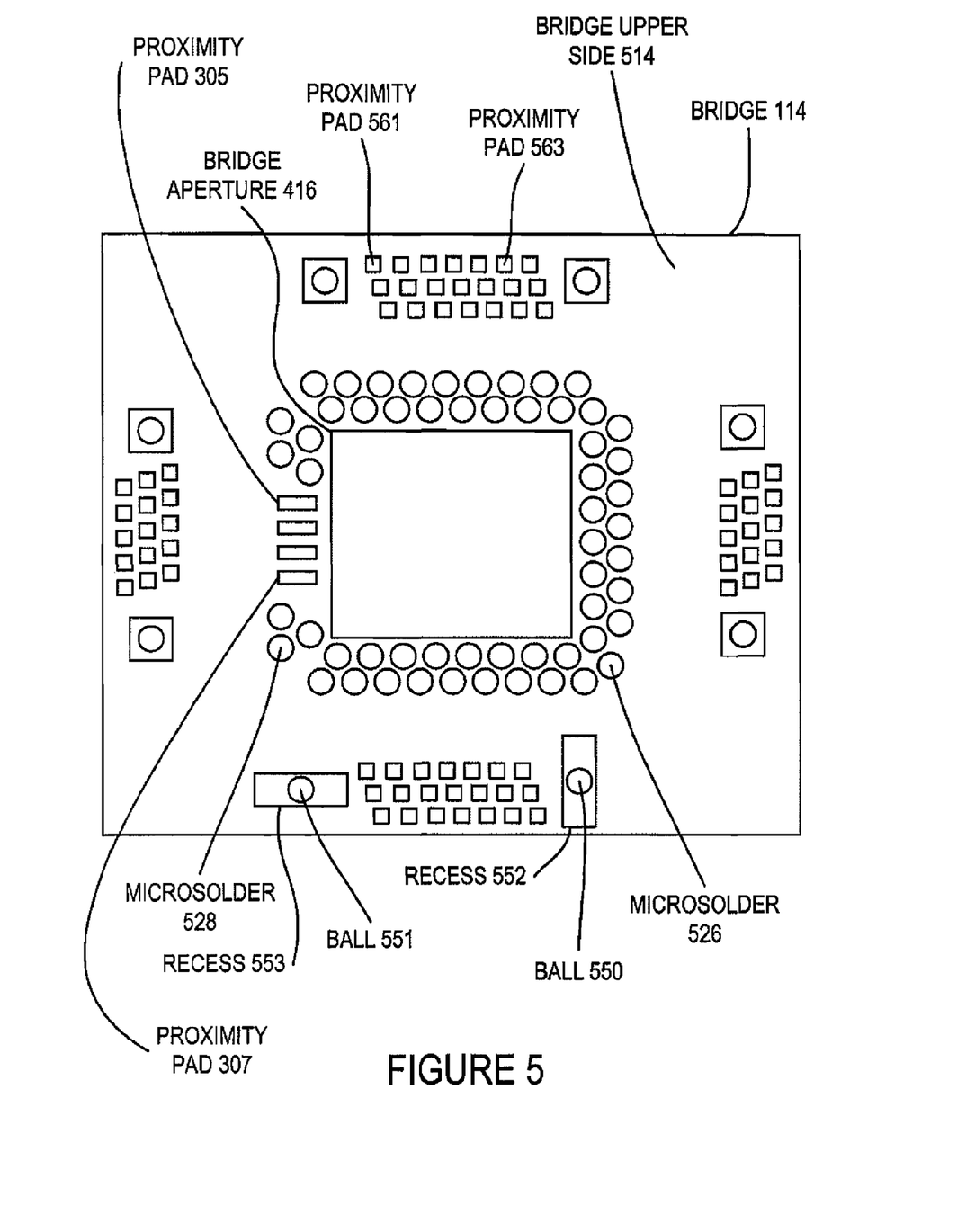
FIG. 5 illustrates an upper side or top view of a first bridge in accordance with an example embodiment.

FIG. 5 illustrates an upper side 514 of the bridge 114, as seen for example from the direction 143. The upper side 514 of the bridge 114 includes proximity pads such as the pads 561, 563 to implement the proximity connections (e.g. 110, 112) between the bridge 114 and the caches 106, 108, 207, 209. The upper side 514 also includes micro-solder bumps 526 or other suitable elements to match or mate with the micro-solder bumps of the processor 104, for example the bumps 126, 128, 302, 304. The bridge 114 can also (optionally) include proximity pads such as the proximity pads 305, 307 to correspond to proximity pads on the processor 104 (e.g. pads 305, 307) and form one or more capacitively-coupled proximity connections with the processor 104.

FIG. 5 also illustrates recesses and balls for maintaining proper clearance for proximity connections between proximity pads of the bridge 114 and the cache memories 106, 108 (207, 209), for example balls 550, 551 that fit respectively into recesses 552, 553. In example embodiments, ball and etch pits or recesses can be co-fabricated at the wafer level to align the four cache chips to the Sombrero bridge. The ball and recess alignment mechanism can help prevent thermal mismatches from overwhelming the package, by maintaining clearance between opposing pads of the capacitive proximity coupling while allowing lateral movement or movement orthogonal to the clearance dimension. For example, the ball and recess alignment would maintain vertical clearance between the bridge 114 and the caches 108, 106 in FIG. 1, but would allow them to move horizontally relative to each other, for example as bridge 114 absorbs heat from the processor 104 and expands laterally towards the interposers 116, 120 underneath the caches 108, 106. The recesses can be square or rectangular as shown for example in FIG. 5, or can be any shape and lateral size to allow a desired degree of movement. For example, opposite recesses where one or both of the recesses has lateral dimensions large enough to allow the ball sandwiched by the two recesses to move in one or both of the recesses, will permit relative lateral movement of the two elements bearing the opposing recesses. In an example embodiment rectangular recesses are provided, as for example the recesses 553, 552 shown in FIG. 5, and matching rectangular recesses in the opposing surfaces of the cache memories are oriented so that their long axes are orthogonal to those of the bridge recesses to allow relative movement of the caches with respect to the bridge in two dimensions. For example, in this embodiment the cache recess that matches the bridge recess 552 would have a long axis oriented the same direction as the long axis of the bridge recess 553. Thus the ball and recess mechanism holds tolerance in the third dimension but allows movement in the other two dimensions.

Although this lateral movement can misalign proximity pads on opposite sides of a proximity connection, this misalignment can be mitigated or overcome using logical alignment techniques or mechanisms, as variously described for example in US Publications No. US 2005/0054139 A1; US 2004/0018654 A1; US 2006/0252162 A1; and US 2006/0095639 A1; which are incorporated by reference. Generally speaking, rate of thermal change of the chip systems illustrated for example in the Figures is much slower than the rate at which data is transferred through the proximity connections, and thus can be effectively compensated, for example via pad size and/or pad logic or other techniques. Thus, in example embodiments thermal movement of the chips does not degrade or significantly affect data transfer through the proximity connections.

Figure 6:
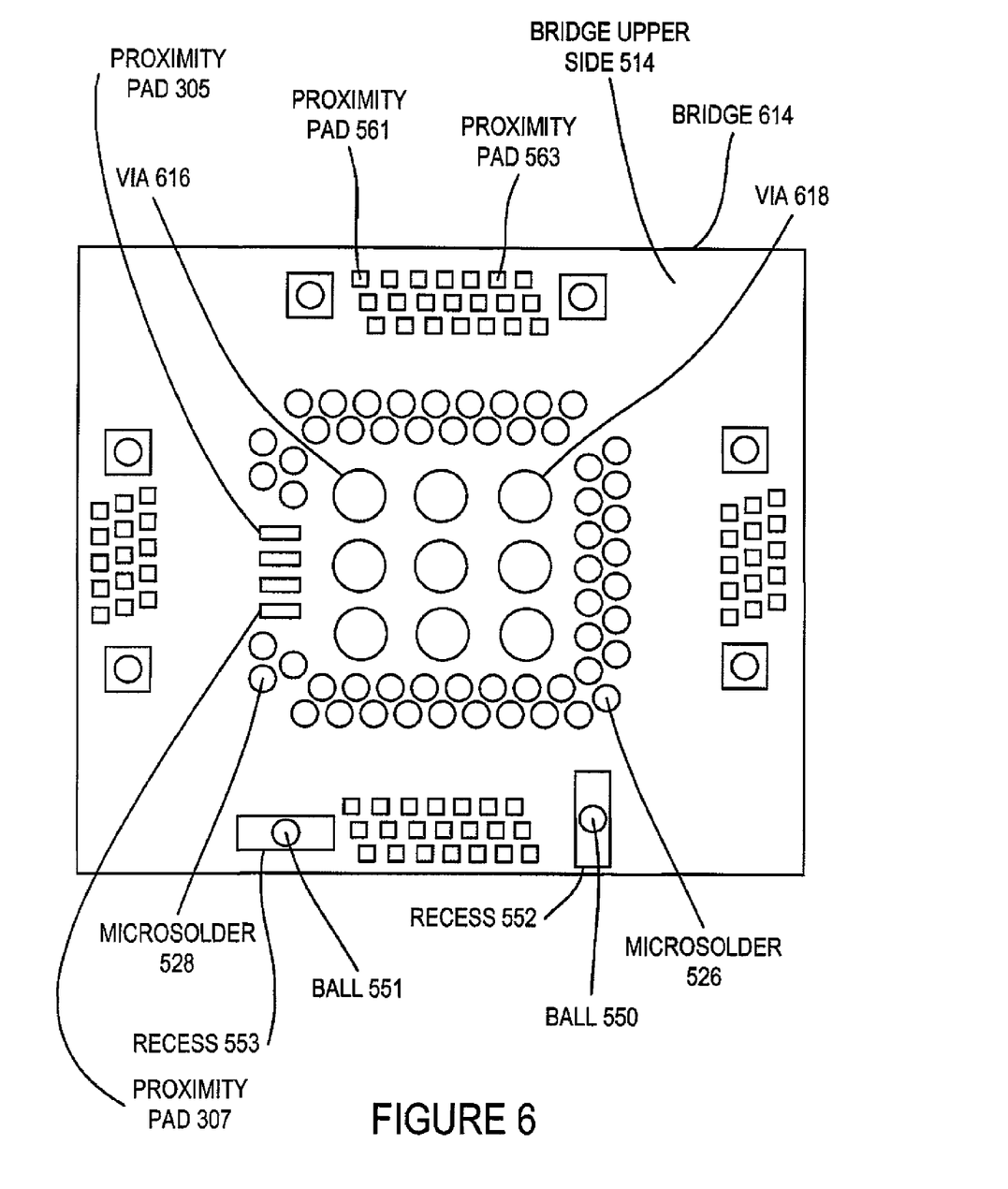
FIG. 6 illustrates an upper side or top view of a second bridge in accordance with an example embodiment.
Figure 7:
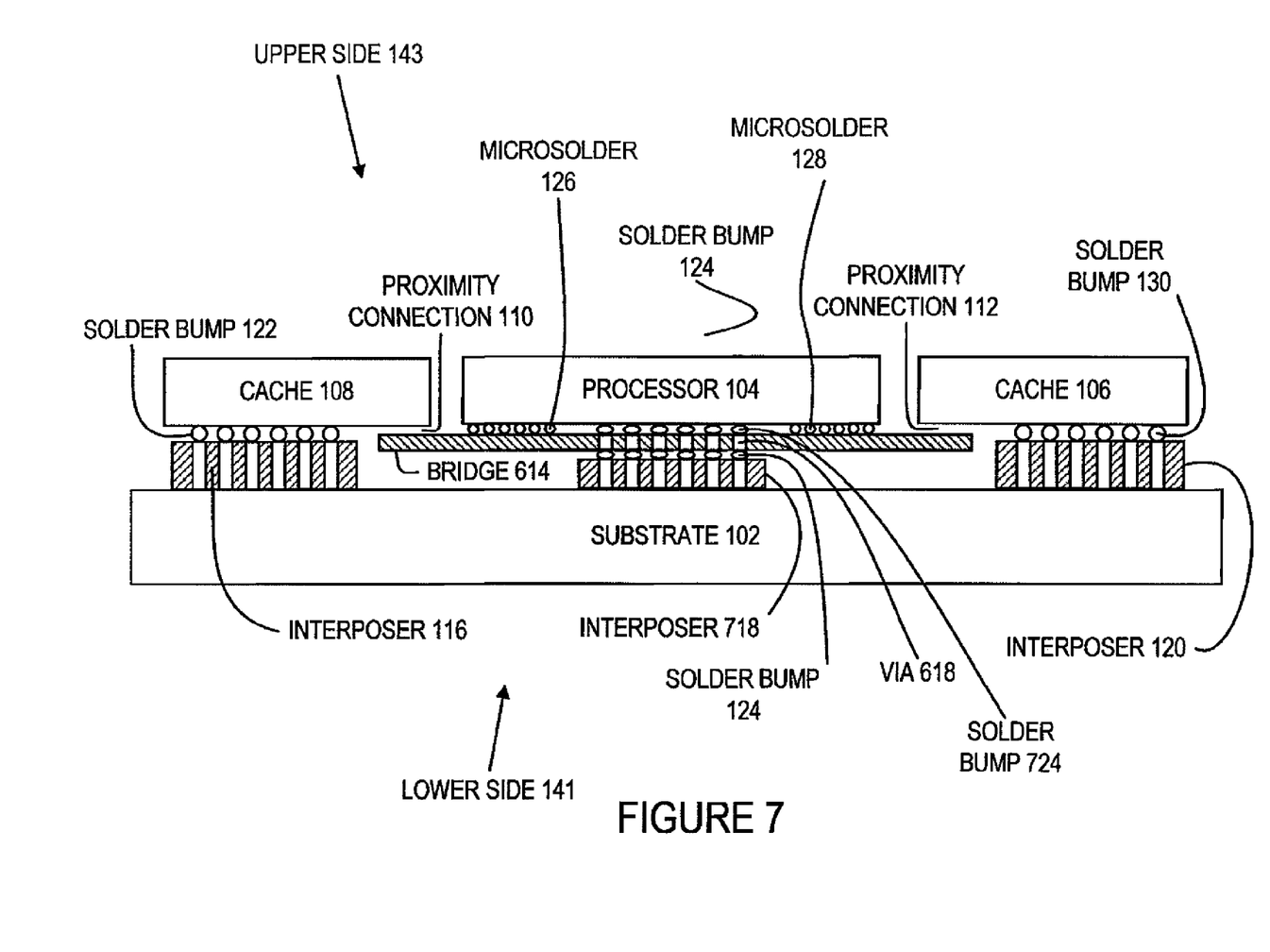
FIG. 7 illustrates an example system that incorporates the second bridge shown in FIG. 6.

FIG. 6 illustrates an example bridge 614 in accordance with a different embodiment, wherein the bridge 614 is the same as the bridge 114 except that instead of having a single aperture 416 that exposes underside contacts of the processor 104, the bridge 614 includes vias such as the vias 616, 618 to transmit signals from the processor 104 to another device. FIG. 7 illustrates a side view of an implementation with the bridge 614, where the solder bumps of the processor 104 (e.g. solder bump 724) contact and electrically connect to the vias on one side, and solder bumps (e.g. 124) on the other side connect the other sides of the vias to an interposer 718 that in turn connects to the substrate 102.

Example embodiments of the sombrero bridge described herein can also eliminate second level package undulations in either ceramic, organic, or PCB (printed circuit board) substrates. The sombrero bridge can for example be thinned either at the wafer level or at the die level, to provide compliance to compensate or mitigate topology variations in the first level package. In other words, topology variations in the first level can be mitigated to within a few thousandths of an inch due to compliance in the wings of the sombrero bridge, for example the outer portions of the bridge that extend beyond connections to the processor. For example, the bridge can be thinned from a thickness of 700-800 microns or micrometers down to 200-300 microns or less, or to less than 150 microns, or less than 100 microns, or less than 50 microns. Thus the bridge becomes compliant to compensate for undulations and still provide correct proximity connection tolerances (e.g. via the ball and etched recess mechanism), allowing for example 20-30 microns of compliance, or more or less depending for example on such factors as a thickness of the bridge, a particular material composition of the bridge, a lateral distance of the bridge that provides the compliance (e.g., a distance between one or more soldered connections that attach the processor to the bridge and a nearest ball recess of the bridge), and so forth. Bridge thickness, material, and span can thus be variously selected to provide any desired degree of compliance for a particular application. For example, the bridge can be made of silicon, or any other appropriate material(s) or composition(s). The various components can be fastened and/or pressed together to provide necessary force to flex the bridge and provide compliance as well as proper proximity connection clearances. In an example embodiment, the bridge can have a non-uniform thickness. For example, thickness near the bridge recesses can extend on the back side of the recess or opposite side of the bridge from the recess to provide the recessed area with sufficient strength.

In example embodiments the bridge chip can be made of or include a different class of materials than the processor (which can be made using Silicon for example). For instance, the bridge can include or comprise Silicon Germanium or Group III-V compound semiconductors such as Gallium Arsenide or Indium Phosphide, or any appropriate combination thereof. In an example embodiment, the bridge can be made of or include organic electronics, or plastic electronics. In addition, the bridge can be formed either as a single chip, or a chip on a (compliant) Printed Circuit Board, or a chip on a Ceramic substrate, and so forth.

In some embodiments, physical clearances of proximity connections between the bridge and one or more cache memories or other components, and/or between the bridge and one or more processors, can be maintained by ball and socket mechanisms described herein, or by any other mechanism.

In an example embodiment, the bridge is electrically conductively connected to one or more of the cache memories, for example by solder connections, and communicates (e.g., exchanges data or information) with the processor via proximity connections.

In an example embodiment, all communication signals between the bridge and the processor and between the bridge and the cache memories are conveyed via proximity connections. In this and other embodiments, the bridge can be supported directly (or indirectly via an intervening support member) by the substrate. In this embodiment, the bridge can optionally include one or more electrically conductive power connections to the processor and/or one or more of the cache memories.

Figure 8:
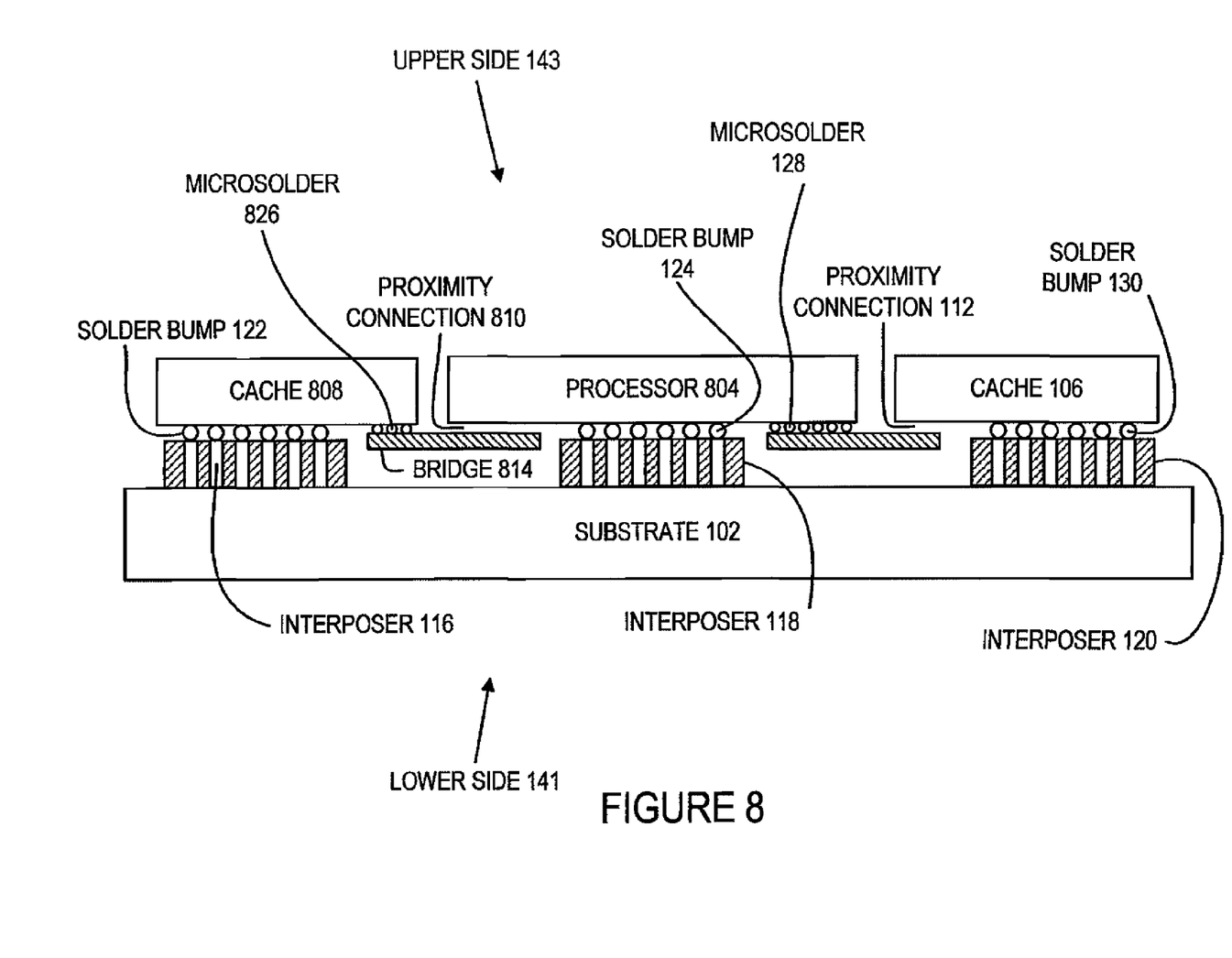
FIG. 8 illustrates an example of a system with proximity connections between the processor and the bridge and electrically conductive connections between the bridge and a cache memory.

In an example embodiment, the bridge is arranged or configured to connect with a processor (or processors) and different cache memories in different ways. For example, the bridge can communicate with a first cache memory via one or more proximity connections, and can communicate with a second cache memory via one or more conductive connections. The bridge can communicate with the processor via proximity connections, and/or via conductive connections. For example, FIG. 8 shows a bridge 814 that has electrically conductive connections (e.g. micro-solder bumps 826) with a first cache memory 808 and proximity connection(s) 810 with the processor 804. FIG. 8 also shows that the bridge 814 has proximity connection(s) 112 with the second cache 106 and electrically conductive connections (e.g. micro-solder 128) with the processor 804.

Thus data communications between the bridge and the one or more cache memories or other devices can be conveyed via proximity connections, or electrically conductive connections, or both; and data communications between the bridge and the processor or processors can be conveyed via proximity connections, or electrically conductive connections, or both.

In an example embodiment, the bridge comprises multiple subcomponents, sub-bridge chips that are independently manufactured and then bonded or fastened together (e.g. via microsolder and/or other physically connective and optionally conductive mechanisms, for example adhesive, interlocking or interfering shapes, clips, fasteners, or combination of these or other mechanisms) to form a bridge that includes a central aperture. Any number of sub-bridges can be used to form a bridge, for example two, three, four or more. The sub-bridges can be symmetrical and/or similarly sized, can be differently sized, can be non-symmetrical, and different sub-bridges can have different shapes and/or sizes. In an example embodiment, the bridge is formed by concentric sub-bridges, for example rings or other shapes that feature a central aperture. In an example embodiment, data communication connections between sub-bridges of a bridge and/or between sub-bridges of adjacent bridges are formed via proximity connections, or conductive connections, or both. In an example embodiment, power connections between sub-bridges of a bridge and/or between sub-bridges of adjacent bridges are formed via conductive connections. In an example embodiment, a bridge made of multiple sub-bridges includes one or more frames or structures that support or locate two or more sub-bridges relative to each other.

Although not shown in the Figures, TIMs (Thermal Interface Materials) and heat sinks can be provided, for example on an opposite side of the caches and processor from the substrate 102 so that the caches or other memory devices, processor(s), and bridge(s) are sandwiched between a first layer such as the substrate 102 and the TIMs and/or heat sinks.

A multi-chip unit of processor, bridge, and one or more cache memories can be attached to a first level package so as to enable elimination of the known good die, enable pre-testability, and solve reworking problems, as shown for example in FIGS. 1 and 7, where the interposers attach to a second level package 102 that can be industry standard ceramic, can be formed with organic technology, or can embody PCB (Printed Circuit Board) technology. The interposers enable the processor 104 to be tested independently of the package. Additionally, with other test infrastructure the processor and sombrero bridge can be tested before they are assembled in a final package. Likewise the cache chips can be pre-tested before assembly. This can dramatically improve yield on final product parts. Furthermore if rework is required the cache chip can be removed and then the processor chip can be tested at the package level to identify failures in time for the processor. The processor is likely to have the highest Failure-in-Time rates and also the lowest good-die yield.

A bridge and processor package can be constructed in different ways. For example, a "flip-chip" process can be used to first form and shape the bridge, and then the processor can be bonded, fastened or otherwise attached to the bridge, for example by soldering and/or other mechanisms.

To prevent thermal mismatches from overwhelming the package, in example embodiments interposers can be optionally deployed between the processor and a first level package. Interposers can mitigate the CTE (coefficient of thermal expansion) mismatch and reduce effects of thermal expansion between chips. Conversely, although interposers are shown in FIGS. 1 and 7, they can be omitted, and the corresponding connections can be made directly to other components.

Although FIG. 2 shows an embodiment wherein the bridge has a square perimeter and connects to four caches, one on each side of the perimeter, in other embodiments the bridge can have a different perimeter shape, for example a hexagon or any other polygon (regular or irregular) or any shape or outline such as round, oval, or any combination of straight line segments and/or curves, continuous or non-continuous. Fewer or greater than four caches can be connected to the bridge, symmetrically or asymmetrically with respect to the shape or outline of the bridge. For example, the sombrero bridge can be fabricated to extend beyond the processor on two sides, to accommodate connections to two cache memories on two sides of the bridge. The two sides can be opposite sides, or can be adjacent sides.

Although FIGS. 1, 2 and 7 illustrate embodiments wherein the processor and the cache memories connect to the same face of the bridge, in other embodiments they can connect on different or opposite faces of the bridge, and different cache memories can connect to different faces of the bridge. For example, on one side a cache memory can connect to an upper face of the bridge via a proximity connection, and on another side of the bridge another cache memory can connect to a lower face of the bridge. Ball recesses can also be provided on opposite or different faces of the bridge. Thus, the order or sequence of various components described herein and/or shown in the Figures can be variously changed or organized.

Note that sizes of the various proximity pads, solder bumps, and other connections or elements shown in the Figures are not necessarily to actual scale or relative scale but are generally intended for the purposes of illustration and understanding.

The examples provided should not be construed as narrowing the embodiments of the invention, and are intended merely to provide a better understanding. Thus, other mechanisms may therefore be employed, without departing from the scope of the invention.

The above specification, examples, and data provide a complete description of the manufacture and use of the composition of the invention. Since many embodiments of the invention may be made without departing from the spirit and scope of the invention, the invention resides in the claims hereinafter appended.

What is claimed as new and desired to be protected by Letters Patent of the United States is:

1. A system comprising:
    a processor;
    at least one cache memory;
    a bridge that surrounds a perimeter of the processor, wherein the bridge enables signal communication between the at least one cache memory and the processor, and wherein a center portion of the bridge is open, forming an aperture through the bridge;
    a power connection through the aperture to the processor;
    at least one proximity connection between the bridge and at least one of the at least one cache memory or the processor, wherein the at least one proximity connection is arranged to carry the signal communication.

2. The system of claim 1, comprising at least one proximity connection arranged to carry the signal communication between the processor and the bridge.

3. The system of claim 1, wherein the at least one cache memory is located relative to the bridge via a plurality of recesses in a surface of the at least one cache memory, a plurality of corresponding recesses in an opposing surface of the bridge, and a ball for each matching pair of corresponding cache memory and bridge recesses wherein the ball is located between the cache memory recess and the corresponding bridge recess that form the matching pair.

4. The system of claim 3, wherein the at least one proximity connection comprises at least one pad on the cache memory and at least one pad on the bridge, and wherein the balls and matching pairs of recesses constrain a minimum distance between the at least one pad on the cache memory and the at least one pad on the bridge.

5. The system of claim 3, wherein the recesses are rectangular, and long axes of the cache memory recesses are orthogonal to long axes of the corresponding bridge recesses.

6. The system of claim 1, wherein a compliance of the bridge mitigates topology variations in the system.

7. The system of claim 1, comprising a second level package device and a data connection through the aperture between the processor and the second level package device.

8. The system of claim 1, wherein the bridge comprises multiple apertures through the bridge and opposite the processor, each of the apertures forming a via that connects to the processor and is arranged to transport power or data signals.

9. The system of claim 1, wherein the bridge has a thickness of less than 150 micrometers.

10. The system of claim 1, wherein the bridge has a compliance ranging between 20 and 30 micrometers.

11. The system of claim 1, wherein the processor is a microprocessor.

12. The system of claim 1, comprising at least one electrically conductive connection between the bridge and at least one of the processor or the at least one cache memory, wherein the electrically conductive connection comprises electrically conductive material attached to the bridge.

13. The system of claim 12, wherein the at least one electrically conductive connection connects the bridge to the processor.

14. The system of claim 12, wherein the at least one electrically conductive connection connects the bridge to the at least one cache memory.

15. The system of claim 1, wherein the bridge comprises a plurality of sub-bridges that are separately manufactured and then joined together to form the bridge.

16. The system of claim 1, comprising at least one electrically conductive connection between the means for transmitting data and at least one of the processor or the at least one cache memory, wherein the electrically conductive connection comprises electrically conductive material attached to the means for transmitting data.

17. A system comprising:
   a processor;
   at least one cache memory; and
   means for transmitting data between the processor and the at least one cache memory via at least one proximity connection, wherein the means for transmitting data surrounds the processor using a substrate, and wherein a center portion of the means for transmitting data is open, forming an aperture through the means for transmitting data.

18. The system of claim 17, comprising at least one proximity connection arranged to carry the signal communication between the processor and the means for transmitting data.

19. The system of claim 17, wherein the at least one cache memory is located relative to the means for transmitting data via:
   a plurality of recesses in a surface of the at least one cache memory, a plurality of corresponding recesses in an opposing surface of the means for transmitting data, and a ball for each matching pair of corresponding cache memory and recesses in the means for transmitting data wherein the ball is located between the cache memory recess and the corresponding recess in the means for transmitting data that form the matching pair.

20. The system of claim 17, wherein the means for transmitting data has a thickness of less than 150 micrometers and a compliance ranging between 20 and 30 micrometers.

* * * * *